United States Patent
Mela et al.

(10) Patent No.: US 7,655,383 B2
(45) Date of Patent: Feb. 2, 2010

(54) PHOTOCHEMICAL METHOD FOR MANUFACTURING NANOMETRICALLY SURFACE-DECORATED SUBSTRATES

(75) Inventors: Petra Mela, Aachen (DE); Marcell Ott, Stuttgart (DE); Joachim Spatz, Herdenheim (DE); Blazej Gorzolnik, Aachen (DE); Martin Möller, Aachen (DE)

(73) Assignee: DWI an der RWTH (DE)

( * ) Notice: Subject to any disclaimer, the term of this patent is extended or adjusted under 35 U.S.C. 154(b) by 449 days.

(21) Appl. No.: 11/510,276

(22) Filed: Aug. 24, 2006

(65) Prior Publication Data

US 2009/0308842 A1 Dec. 17, 2009

(30) Foreign Application Priority Data

Sep. 5, 2005 (EP) .................... 05 019 237

(51) Int. Cl.
*G03F 7/00* (2006.01)
(52) U.S. Cl. .............. 430/311; 430/313; 430/322; 430/323
(58) Field of Classification Search .............. 430/311, 430/322, 323, 313
See application file for complete search history.

(56) References Cited

U.S. PATENT DOCUMENTS 5,002,854 A * 3/1991 Fan et al. ............... 430/270.1
6,013,855 A * 1/2000 McPherson et al. ....... 623/23.76

FOREIGN PATENT DOCUMENTS

DE 19747816 * 5/1995
WO WO9921652 * 5/1999

OTHER PUBLICATIONS

European Search Report, Application No. EP 05 01 9237, mailed Jul. 3, 2006.
Spatz et al.; "Micro-Nanostructured Interfaces Fabricated by the Use of Inorganic Block Copolymer Micellar Monolayers as Negative Resist for Electron-Bean Lithography"; *Advanced Functional Materials*; vol. 13, No. 7, Jul. 2003; pp. 569-575.
Spatz et al.; "Block Copolymer Micelle Nanolithography"; *Nanotechnology*; Vo. 14; Sep. 2003; pp. 1153-1160.

* cited by examiner

*Primary Examiner*—Mark F Huff
*Assistant Examiner*—Caleen O Sullivan
(74) *Attorney, Agent, or Firm*—Renner, Otto, Boisselle & Sklar

(57) ABSTRACT

The present invention relates to a photochemical method for manufacturing nanometrically surface-decorated substrates, i.e. the creation of periodic and aperiodic patterns of highly ordered inorganic nanostructures on a substrate. This method is based on the selective photochemical modification of a self-assembled monolayer of metal compound loaded polymer core-shell systems on widely variable substrates. Light exposure through an appropriate mask causes selective chemical modification of the polymer core shell system. By subsequently placing the substrate in an appropriate chemical solution that eradicates the non-modified polymer, the pattern given by the used mask is reproduced on the surface. Finally, the remaining organic matrix is removed and metal salt is transformed to the single metal or metal oxide nanodots by means of gas plasma treatment.

14 Claims, 6 Drawing Sheets a)

b)

a)

b)

c)

PHOTOCHEMICAL METHOD FOR MANUFACTURING NANOMETRICALLY SURFACE-DECORATED SUBSTRATES

RELATED APPLICATIONS

This application is related to and claims priority under 35 U.S.C. 119(a) to European Application No. 05 019 237.6, filed on Sep. 5, 2005, the entirety of which is hereby incorporated herein by reference.

TECHNICAL FIELD

The present invention relates to a photochemical method for manufacturing nanometrically surface-decorated substrates, i.e. the creation of periodic and aperiodic patterns of highly ordered inorganic nanostructures on a substrate. This method is based on the selective photochemical modification of a self-assembled monolayer of metal compound loaded polymer core-shell systems on widely variable substrates. Light exposure through an appropriate mask causes selective chemical modification of the polymer core shell system. By subsequently placing the substrate in an appropriate chemical solution that eradicates the non-modified polymer, the pattern given by the used mask is reproduced on the surface. Finally, the remaining organic matrix is removed and metal salt is transformed to the single metal or metal oxide nanodots by means of e.g. gas plasma treatment. The present invention represents a simple and low-cost combination of "top-down" and "bottom-up" approaches that allows decoration of large areas with periodic and aperiodic patterns of nano-objects, with good control over two different length scales: nano- and micrometers.

BACKGROUND

The intensive development in fields of technology such as electronics, biology, and material science is a strong force towards stimulating nanotechnology in general and the synthesis of nanomaterials in particular. The driving force that pushes research toward the investigation of materials at the nanometer and atomic scale is linked to the need, in modern technology, of miniaturizing systems and devices and of dramatically increasing their efficiency.

There is a further need for simple, economically feasible and reliable techniques for the preparation of functional nanoscale periodic and aperiodic patterns on surfaces, for instance, in order to provide selective seeds for electroless deposition of Cu during fabrication of printed circuits and boards. In the widely applied current method the conductive thin layer of copper is deposited onto the dielectric substrate and generally in order to plate on the substrate it must be seeded or equipped with special catalyst prior to deposition of metal. By the established method the selective formation of metallic particles (seeds) requires many steps and therefore is complicated and expensive.

Another promising application of nanostructured surfaces is the production of functional nanoscale devices, such as quantum dot transistors, where the data are transmitted not by currents, like in traditional technologies, but single electrons which jump from one quantum dot to another. This is of great importance in research activities on single-electron devices (SEDs), where the driving force is the limitation in trend towards reducing the size while increasing the complexity of traditional chips.

Nanoarrays of the clusters can be used in "bio"-applications such as decoration of the surfaces with bio-molecules. Here, a patterned surface where molecularly well-defined adhesive spots are separated by the desired non-adhesive regions can provide special binding groups for selective proteins. The high precision in construction such binding sites allows to mimic nature, which very selectively binds molecules to their receptors in a way as key fits into lock. This is of high interest in fabrication of nanosensors, bio-chips, high density data storage devices and other applications from the border of biology and nano-electronics.

The surface selectively decorated with metal spots has great importance for the optical properties used in sensors and analytical devices such as Surface Enhanced Raman Spectroscopy and Imaging Ellipsometry, where in order to achieve highest quality and reliable results the spots should possess homogeneous density, the same shape and size.

The fabrication of devices with nanometer precision can be achieved following two different approaches: the top-down approach which scales down devices to the nanometer level, and the bottom-up approach which uses certain strategies to obtain building blocks for the construction of nanometer devices.

The "top-down" approach is based on a variety of different lithographic techniques like the well-established photolithography, ion-beam, electron- or X-ray lithography. These methods allow the fabrication of periodic and aperiodic patterns with good resolution down to 100 nm (optical lithography) or even 10 nm (e-beam lithography). However, as lithography moves to shorter wavelengths, the associated costs of the process increase very rapidly. Also different unconventional scanning probe lithography methods such as "dip pen" nanolithography (DPN) can be used to selectively decorate surfaces with nano-objects. The dimensions accessible with these techniques fulfill most of the current requirements for electronic and biological applications.

The "bottom-up" approach exploits the self-assembly of molecules into nanostructures. Molecules such as organic conjugated-molecules, surfactants or block copolymers can self-organize into periodic patterns with the resolution of few nanometers. The pattern is controlled by the "chemistry" of the molecule and can be designed by the proper synthetic pathway that leads to appropriate structures of the molecule and in consequence to desired patterns. Block copolymers can form a rich variety of nanoscale periodic patterns. The morphology of obtained nanoscale structures and their periodicities depend on molecular weight, the strength of interaction between the blocks (represented by the Flory-Huggins interaction parameter, $\chi$) and the volume fraction of one of the constituent blocks.

In EP 1 027 157 B1 there is disclosed that metal nanoparticles can be patterned at the surface using the self-organisation of block copolymers to core-shell systems (e.g. micellar structures) which act as nanoreactor in particle formation. In the method disclosed therein, for example, an amphiphilic poly(styrene)-b-poly(2-vinylpyridine) polymer is dissolved in a selective solvent and reverse micelles are created, where PS blocks form corona and P2VP core of the micelles. Addition of $HAuCl_4$ to the system results in complexation of inorganic salt by the core of the micelle. The loaded micelles are transformed onto the surface of the substrate in a form of regular pattern. Subsequently the polymer matrix is removed, for example by gas plasma treatment. At the same time metal nanoparticles are produced by the reduction of the precursor salt. The thus obtained single Au clusters are deposited on the surface in a pattern reflecting the previous micellar arrangement. The size of the cluster can be adjusted in the range from 1 to 15 nm, while the interparticle distance can reach >200 nm. The method of preparation ordered nanoparticles as described in EP 1 027 157 B1 is not limited to the exemplary system HAuCl$_4$ in PS-b-P2VP micelles, but a large variety of inorganic precursor salts and block copolymers can be chosen as well as various substrate materials.

Self-organization is a very powerful way of obtaining nanoscale patterns, however it is hard to prepare non-periodic structures in this way.

Aperiodic structures of nanoscale ordered nano-objects can be achieved by combining self-organization of the macromolecules on the nanometer scale and fabrication of large scale structures by "top-down" technique.

An example of such combination is the microcontact printing (μCP) of self-assembled monolayers on substrates. Poly (dimethylsiloxane) (PDMS) stamps are molded on masters fabricated by photolithography or e-beam lithography. A thus prepared stamp is then used to transfer molecules of the "ink" to the surface of the substrate by contact. However, when applied at the nanoscale, μCP remains a more significant challenge than producing micrometer scale patterns. Two key factors that determine the limits of resolution are lateral diffusion of the molecules and distortions of the stamp. Nevertheless, lateral dimensions as small as 50 nm can be achieved.

Recently, two methods for the realization of periodic and aperiodic patterns of core-shell systems on substrates have been proposed. One method combines e-beam or photosensitive resist pre-structuring with self-assembly of the core-shell systems such as for example block copolymer micelles; cf. EP 1 244 938 B1. In this method the template is formed on the e-beam resist by writing a pattern by e-beam lithography and further developing written areas. Onto the resist which possess patterned lines, loaded micelles are deposited for example by spin-coating. During the evaporation process, due to capillary forces micelles move inside the groves. Next, the resist is dissolved in an appropriate solvent and only micelles with direct contact with the substrate remain. The polymer matrix is removed and the precursor salt is reduced to the noble metal for instance by a gas plasma process. This approach can be used for the arrangement of nanoclusters in a variety of patterns, for example 7 nm wide lines, separated by 500 nm. This technique allows the positioning of particles with nanometer size in periodic and non-periodic patterns, in contradiction to traditional lithographic approaches which are not able to write structures in nanometer dimensions over large micrometer areas, whereas self-assembly methods fail in positioning particles in artificial patterns with large separation distances.

The second proposed method is based on direct e-beam writing of monomicellar films which function as negative resist; cf. R. Glass et al., Adv. Funct. Mater. 2003, 13, 569. A flat substrate is covered with the monolayer of loaded micelles, assembled into highly ordered periodic structures. Areas of the micellar monolayer are directly exposed to the electron beam that modifies the polymer chemically. Non-irradiated micelles are removed from the substrate by the lift-off procedure using an appropriate solvent. A final treatment leaves pattern of gold nanodots on the surface, removing all organic material. Squares, circles and rings, each consisting of nanoclusters with uniform size and interparticle distance, ranging from a few nanometers up to several micrometers can be produced by this technique. The e-beam writing on micellar monofilms requires very precise electron dose and time of irradiation. Any deviation in electron exposure results in not fully crosslinking of the polymer (in consequence lifting-off also irradiated micelles) or partially reduction of the metal leading to broad size distribution of the micelles and destruction of short-range order between the particles.

Both approaches as discussed hereinabove, however, require very expensive equipment or high energy doses, respectively. Further, they are time-consuming serial processes not suitable for patterning of large areas. Moreover, they are not suitable for non-conductive substrates, unless additional treatment is carried out.

Accordingly, there still exists a strong need for a more simple and efficient method for manufacturing nanometrically surface-decorated substrates without the shortcomings mentioned above. Thus, it is an object of the present invention to provide an economic method for manufacturing nanometrically surface-decorated substrates, which allows decoration of large areas with periodic and aperiodic patterns of nano-objects, with good control over two different length scales: nano- and micrometers.

SUMMARY

The solution to the above technical problem is achieved by providing the embodiments characterized in the claims.

In particular, there is provided a method for manufacturing nanometrically surface-decorated substrates, comprising the steps:

(a) depositing a core-shell polymer system, prepared by taking up a polymer in a suitable solvent with formation of a dissolved core-shell polymer system and loading of at least part of the polymer cores with one or more, identical or different metal compounds, as a film onto a substrate so that at least one side of the substrate is configured in a regular structure, (b) irradiating said polymer film on the substrate as obtained in step (a) through a desired mask, by a light exposure that causes a chemical modification of the polymer in the irradiated areas, (c) removing the non-modified core-shell polymer system from the substrate by means of dissolution with a suitable solvent, and (d) removing the polymer core-shell system as irradiated in step (b) while producing metal clusters and/or metal compound clusters on the substrate without thereby significantly modifying the structure erected by the core-shell system.

By the method according to the present invention, there is adopted a "photo-pinning" method as a cheap and easy combination of self-assembly and optical lithography. The method according to the present invention is simple, parallel and requires only a light source and a mask to transfer the desired patterns onto the layers even on large areas. The method is based on the selective photochemical modification of a self-assembled monolayer of metal compound loaded polymer core-shell systems on widely variable substrates. Light exposure through an appropriate mask causes selective chemical modification of the polymer core shell system. By subsequently placing the substrate in an appropriate chemical solution that eradicates the non-modified polymer, the pattern present on the used mask is reproduced on the substrate's surface. Finally, the remaining organic matrix is removed and metal salt is transformed to the single metal or metal oxide nanodots by means of e.g. gas plasma treatment.

DETAILED DESCRIPTION

One key point of the method according to the present invention is the capability of generating radicals during the irradiation process. The realization of the pattern is surprisingly straightforward on e.g. a block copolymer where one of the block is represented by for example poly(isoprene) or poly(butadiene). However, even polymers that do not possess chemical groups which can react under light exposure like UV exposure (for instance poly(styrene)), can still be patterned by addition of a UV-active compound such as photoinitiators, monomers with double bond functionality or by pre-functionalisation of the surface. Thus, either the polymer itself constituting the core-shell polymer system is capable of generating radicals by subjecting to light exposure or radicals are generated by addition of a UV-active compound such as photoinitiators, monomers with double bond functionality or by pre-functionalisation of the surface.

The step (a) of the method according to the present invention relates to the deposition of a film of the core-shell systems, in which the core is loaded with one or more identical or different metal compounds, on the substrate.

The substrate can be selected from precious metals, oxidic glasses, monocrystalline or multi-crystalline substrates, semiconductors, metals with or without a passivated surface, or insulators or in general substrates with high resistance against etching. Especially, the substrate can be made of Pt, Au, $TiO_2$, $Al_2O_3$, GaAs, $In_yGaAs$, $Al_xGaAs$, Si, $SiO_2$, Ge, $Ni_xN_y$, $Si_xGaAs$, InP, InPSi, GaInAsP, glass, graphite, diamond, mica, $SrTiO_3$ or their doped modifications. The substrate can be planar with plain as well as planar with flat corrugated (convex or concave) surfaces.

As core-shell systems used in the present invention structures like for example amphiphilic polymers which in organic or non-organic solvent due to their properties tend to form spherical or worm-like micelles, vesicles and other complex aggregates are provided. In particular, the present invention relates to host-guest systems where the polymer core (in this case a host) can interact with a metal compound (a guest).

Preferably, the polymer which forms in an appropriate solvent core-shell systems, can be selected from block copolymers, graft copolymers, miktoarm polymers, dendritic polymers, star block copolymers, block star polymers, star polymers with different branches, microgel particles or core-shell latex polymers. More preferably, a reverse block-copolymer core-shell system is used in the method according to the present invention.

Particularly, the polymer is a block copolymer where one of the blocks owns chemical groups which are reactive or can be activated by UV light, respectively. Preferably, the polymer is a block copolymer where one block bears olefinic or aromatic groups like isoprene, butadiene or styrene groups. Typical examples are:

poly(isoprene)-b-poly(2-vinylpyridine), poly(isoprene)-b-poly(ethylene oxide), poly(isoprene)-b-(poly-4-vinylpyridine), poly(butadiene)-b-poly(2-vinylpyridine), poly(butadiene)-b-poly-(4-vinylpyridine), poly(butadiene)-b-poly(ethylene oxide) or a block copolymer with a block composed of an unsaturated copolymer. The first block can however also be substituted by an unsaturated non-polar polymer like e.g. poly(styrene). In this case irradiation can be supported by addition of a photoinitiator and/or modification of the substrate by a compound providing photosensitive groups and/or addition of a low molecular compound with groups able to react under light exposure. The second, polar block of the block copolymer can be replaced by another polymer, which provides strong interaction between metal compound and polymer core. Examples are poly(acrylic acid), poly(methacrylic acid), amino-substituted poly(styrene), poly(acrylate) or poly(methacrylate), amino-substituted poly(diene), poly(ethylene imine), saponified poly(oxazoline) or hydrogenated poly(acrylnitril). The first block can be also made of the polar polymer, with the proviso that the metal compound selectively interacts with second polar block.

Typically, the aforementioned polymer systems are dissolved in a suitable solvent like e.g. toluene, cyclohexane or $CHCl_3$ with the concentration of the solution ranging from about $10^{-3}$ to about 100 mg/ml, preferably about 5 mg/ml. After some hours, exemplary about 12 hours, the solution is treated with one or more identical or different metal compounds and for several hours, exemplary about 24 hours intensive stirred, allowing incorporating a metal compound into the core-shell polymer system. Typically, the metal compounds are added as a powdered solid. If required, they can be predissolved in a nonpolar solvent.

The metal compound can be selected, for example, from a compound of Au, Pt, Pd, Ag, In, Fe, Zr, Al, Co, Ni, Ga, Sn, Zn, Ti, Si and Ge in the corresponding oxidation stages or mixtures therefore. Specific examples are $HAuCl_4$, $MeAuCl_4$, where Me denotes an alkali metal, $H_2PtCl_6$, $Pd(Ac)_2$, $Ag(Ac)$, $AgNO_3$, $InCl_3$, $FeCl_3$, $Ti(OR)_4$, $TiCl_4$, $TiCl_3$, $CoCl_3$, $NiCl_4$, $SiCl_4$, $GeCl_4$, $GaH_3$, $ZnEt_2$, $Al(OR)_4$, $Zr(OR)_3$, $Si(OR)_4$, where R denotes a straight chain or branched $C_1$-$C_8$ alkyl residue, ferrocene, a Zeise salt or $SnBu_3H$ or a mixture thereof.

Most preferably, the metal compound is $HAuCl_4$. Typically, 0.01 to 2.0 mol of metal compound, preferentially 0.2-0.8 mol per monomer unit of the polar block is added.

The deposition of the core-shell polymer film onto the substrate can be carried out by dipping, pouring, spin coating, by spraying or by adsorption employing a diluted solution. Most preferable in decorating the substrate is dip coating or spin coating, while polymer core-shell systems e.g. micelles with loaded metal compound, form a regular structure on the surface of the substrate.

Step (b) of the method according to the present invention relies on irradiation of the film on the substrate as prepared by deposition of previously loaded, polymer core-shell systems onto the substrate, through a photolithographic mask, by a source of energy that causes a chemical modification of a polymer in irradiated areas. The irradiation is carried out in such manner that the chemical structure of the polymer is changed, preferentially cross-linked, but in such a manner that the regularity of the pattern on the substrate is not affected.

In step (b) irradiation by visible or preferentially ultraviolet light with the range of 410 nm to 157 nm is intended to modify the structure of the film of core-shell polymer systems. The preferred source of radiation is UV radiation source with emissions in the wavelength range from 190 to 410 nm, particularly about 250 nm. Examples of such UV radiation sources include mercury emitters such as mercury vapour lamps, UV lasers such as pulsed nitrogen laser, gas tubes such as, xenon, deuterium or metal-halide lamps, UV point source radiation emitters such as light emitting diodes and fluorescent black light tubes.

The irradiation time can be, for example, in the range from a few seconds to around 48 hours.

As a desired mask there is meant a physical mask which is selectively shadowing the coated substrate during exposure to the radiation source, made out of material not transparent to source of energy or a mask which is blocking exposure to UV radiation in selected areas. Examples of possible masks are masks used in manufacturing semi-conducting circuits, photomasks such as photolithography masks and mechanical masks used in direct contact to the film.

The irradiation can be supported, for example, by addition of photoinitiators and/or by modification of the surface with a compound that possess UV active groups and/or addition of a low molecular compound with chemical groups being able to react under light exposure. Photoinitiators can be added to the core-shell solution before deposition, as well as, bonded to the surface of the substrate before formation of the core-shell film on it. Suitable photoinitiators include for example benzophenone and its derivatives, in particular commercially available IRGACURE® 184 (1-hydroxy-cyclohexyl-phenyl-ketone) or IRGACURE® 819 (bis-2,4,6-trimethylbenzoyl-phenylphosphineoxide), both supplied by Ciba. The photoinitiators can be used, for example, in amounts from 0.001 to 10 wt. %, based on the amount of solvent. The photoinitiators may be used individually or in combination. Alternatively, before the deposition of the core-shell polymer film onto the substrate, the surface of the substrate can be modified by a compound that possess UV active groups. Preferentially the compound is a silane, particularly methoxy, ethoxy or chlorosilane with double bond functionality or any other group which is active under UV irradiation and able to form chemical bonds. Typical examples are vinyltriethoxysilane, allyltrimethoxysilane and (3-acryloxypropyl)trimethoxysilane. By low molecular compound an unsaturated monomer or prepolymer which can be further polymerised upon UV irradiation, is meant.

The step (c) of the method according to the present invention relates to the removal of non-modified polymer from the surface of the substrate by means of immersion in a suitable solvent. As an analogy to the lift-off process non-irradiated micelles are removed from the substrate and only modified polymer remains in the pattern, inscribed by the irradiation step (b). An example of such lift-off solvent is the solvent in which core-shell structures or block copolymer micelles of a given polymer can be obtained as mentioned above.

Step (d) of the method according to the present invention involves removing the polymer from the developed pattern yielding the substrate decorated by nanodots according to the originally inscribed pattern. Removal of the polymer can be effected e.g. by pyrolysis, oxidation or reduction. The inorganic compound, originally incorporated within shell-core systems is deposited in a form of separated nanometer clusters (dots) on the bare substrate. The nanoparticles are arranged in a pattern, which was designed by the irradiation step (b), with the inter-particular-distance concurrent to the distance between deposited core-shell systems. Removal of the polymer can be achieved by using reactive plasma processes, for example, hydrogen plasma, optionally supported by increasing the temperature. Other methods for removing the polymer shell include reactive gas plasma treatment such as $CF_4$ and/or $SF_x$, oxidation in oxygen containing atmosphere with increased temperature and etching by means of high-energy radiation, especially via electromagnetic or electron radiation.

The procedures described in step (d) remove the polymer matrix of the core-shell structures without disturbing the previous their arrangement, while the precursor inorganic salt is transformed to very small crystalline Me or $MeO_x$ particles which are then agglomerating into Me or $MeO_x$ clusters, so called nanoparticles. Preferred particles are noble metals, such as Au, Pt, Pd, or metal oxide semiconductors like $TiO_2$, or magnetic particles as, for instance, specific modifications of $Fe_2O_3$, Fe, Co, or Ni.

The size of the individual particles can be precisely controlled by the amount of the precursor salt added to the core-shell system solution and the dimensions of the polymer structures, while the distance between the clusters is defined by the molecular weight of the polymers forming core-shell structures. Single clusters are organized in groups so called nano-objects. Separation between groups of nanoparticles as well as the number of nanoparticles per group and their arrangement therein can be defined by the mask used during irradiation step (b). The aperiodic pattern of nano-objects reflects the structure of the mask, through which the irradiation was performed. The method according to the present invention allows structuring large surfaces with nano-objects which are separated over microns and composed of regularly arranged, in nanometer scale, arrays of single clusters. Such clusters can have a diameter from 0.5 to 100 nm and the particle-to-particle distance can vary up to 400 nm, while the groups of particles (nano-objects) can be separated from each other from hundreds of nanometers over even thousands of microns.

The clusters can be composed of identical or different metal atoms and/or metal oxides. In particular, the clusters can contain gold, platinum, palladium, titanium oxide and/or iron oxide. Of particular interest are clusters made of gold atoms and their combinations. The surface of the substrate can be decorated with clusters such as $Au/Fe_2O_3$, $Au/CoO$, $Au/CO_3O_4$, $Au/ZnO$, $Au/TiO_2$, $Au/ZrO_2$, $Au/Al_2O_3$, $Au/In_2O_3$, $Pd/Al_2O_3$, $Pd/ZrO_2$, Pt/graphite or $Pt/Al_2O_3$. Preferred substrates are Pt, Au, GaAs, $In_x$GaAs, $Al_x$GaAs, Si, $SiO_2$, Ge, $Ni_xN_y$, $Si_x$GaAs, InP, InPSi, GaInAsP, glass, graphite, diamond, mica, $SrTiO_3$, and their doped modifications.

The nano-structured macro-surfaces obtained according to the present invention can be used in fabrication of chemical sensors, especially biosensors. The nanoparticles on the surface can act in this case as anchor-points for specific chemical receptors. Due to the reduction in dimensions of nano-objects and controlling their structure, higher sensitivity as well as selectivity can be achieved, while large surfaces decorated with nano-anchors give rise to an increased total signal of the sensor and offer also the possibility to combine several specific interactions on one sensor. Moreover, the substrates decorated with nano-objects as can be obtained by the present invention, can be applied to construction of quantum dot transistors where series of single molecular devices can be manufactured over large areas of a substrate in a cheap, easy accessible and reliable way.

Furthermore, clusters as obtained by the present invention can be used as seeds for electroless deposition. During this process it is possible to grow the size of the single particles, while preserving the shape, size distribution and order of the particles. For example, clusters can be used for deposition of semiconductors such as GaN by means of Metalorganic Vapour Deposition technique. The deposition of material can be carried out in such a way that a thin film of metal and/or metal containing compound on the areas previously decorated with single particles can be achieved. As a result, for instance, different structures such as lines, squares, circuits, etc., composed of thin conducting metal or/and metal containing compound film can be obtained on the substrate used. Of particular interest are periodic structures that can diffract light.

The figures show:

FIG. 1 shows SEM pictures of large area pattern of PI(775)-b-P[2VP(HAuCl$_4$)$_{0.3}$](565) micellar monolayers on silica substrates after selective UV irradiation ($\lambda$=254 nm) and lift-off in toluene of the non-irradiated areas of the layers. The substrates were functionalized with (3-acryloxypropyl)trimethoxysilane before coating of the micellar layer. The circular pattern in a) was obtained by irradiation through a TEM grid (Plano, Marburg, Germany) while the striped pattern in b) was obtained by irradiation through a photolithographic mask.

FIG. 2 shows AFM pictures of a striped pattern of PI(570)-b-P[2VP(HAuCl$_4$)$_{0.3}$](310) micellar monolayer on a silica substrate after selective UV irradiation through a lithography mask and lift-off in toluene of the non-irradiated areas of the layer. The substrate was functionalized with vinyltriethoxysilane before coating the micellar layer. Exposure was performed with λ=254 nm for 35 minutes. Areas marked on large-scale image as 1, 2 and 3 are shown as 4×4 µm pictures below.

FIG. 3 shows SEM images of gold nanodots arranged in a linear pattern on a silicon substrate. The dots were obtained by hydrogen plasma treatment of PI(570)-b-P[2VP(HAuCl$_4$)$_{0.3}$](310) micellar monolayer patterned by photo-pinning. Areas marked on image a) as 1 and 2 are shown in b) and c), respectively.

EXAMPLES

The invention is described in the following examples in more detail, but without being limited to those.

Example 1

Silicon substrates functionalized with self-assembled monolayer ((3-acryloxypropyl)trimethoxysilane) were dip-coated in 5 mg/ml solution of poly(isoprene(775))-b-poly([2-vinylpyridine(HAuCl$_4$)$_{0.3}$](565)) in toluene (the numbers in brackets refer to the number of repeat units of each block). The substrates were subsequently exposed to UV light (λ=254 nm; low pressure laboratory lamp) for 35 min either through Transmission Electron Microscopy (TEM) grids (Piano Company) or through a photolithography mask. The mask consisted of 30 µm wide gold lines separated by 25 µm on UV transparent fused silica (Lithosil Q1, Schott Lithotec AG, Jena, Germany). After exposure, the non-irradiated areas on the substrates were lifted off by immersion in toluene for several hours leaving clear patterns of micelles on the substrates.

Figure 1:
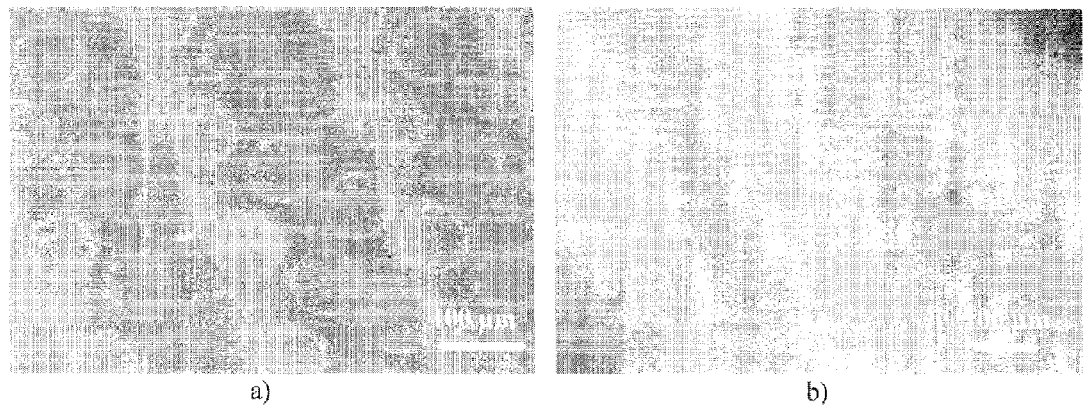

FIG. 1 shows Scanning Electron Microscopy (SEM) pictures of silica substrates covered with patterned monolayers of micelles after UV irradiation and lift-off. The irradiated areas containing micelles are the brighter areas in the pictures.

Example 2

A silicon substrate covered with self-assembled monolayer of vinyltriethoxysilane was dip-coated in 5 mg/ml solution of poly(isoprene(570))-b-poly([2-vinylpyridine(HAuCl$_4$)$_{0.3}$](310)) in toluene. As in Example 1 subsequently irradiation with a UV lamp through the afore-mentioned photolithography mask was performed. As previously, immersion in toluene was used to develop the pattern.

Figure 2:
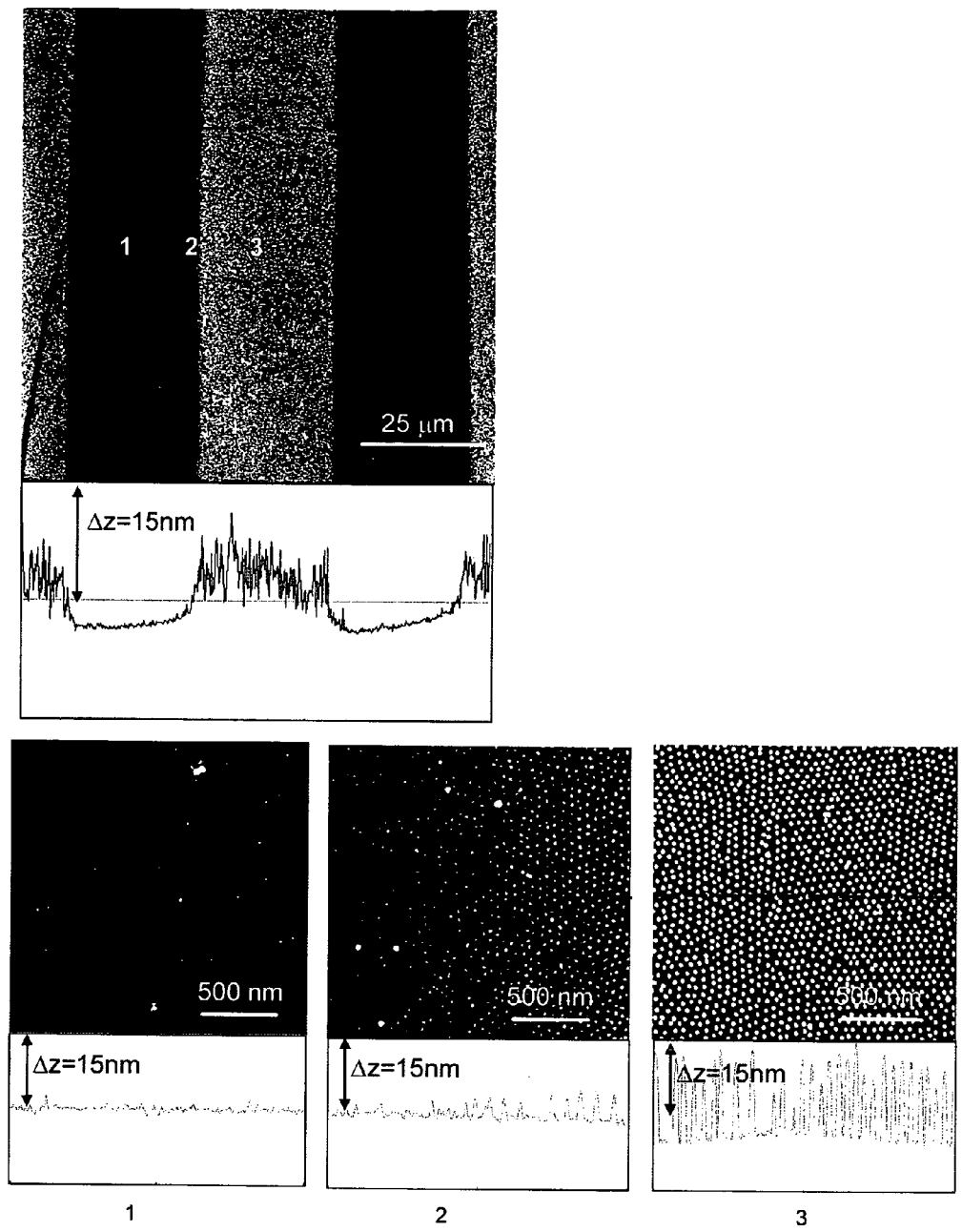

FIG. 2 shows Atomic Force Microscopy (AFM) images of the striped pattern on a 80×80 µm area and 4×4 µm images of a non-irradiated (1), an irradiated (3) and border area (2). Micelles approximately 20 nm high are present in the irradiated area, while the micellar layer has been removed in the non-irradiated area following solvent lift-off, as can be also seen from the cross sections at the bottom of each AFM image.

The sample was then treated with hydrogen plasma process (300 W; 0.096 mbar; 0.5 h); 5 nm gold particles remain on the SiO$_2$ surface.

Figure 3:
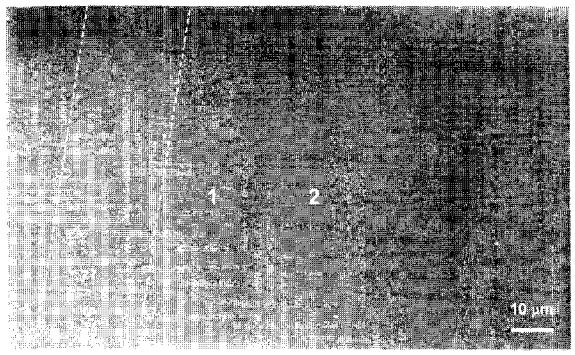
Figure 3:
Figure 3:
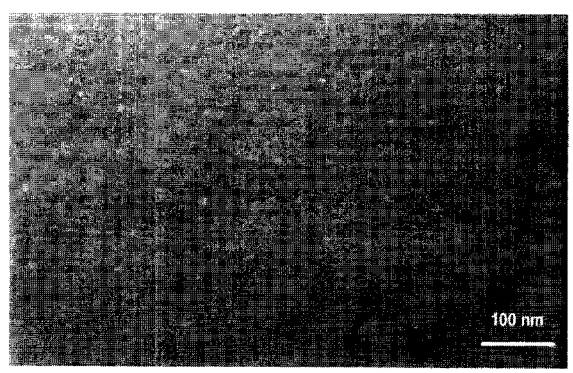

FIG. 3 shows SEM pictures of stripes made of Au clusters deposited on the silica wafer. There can be seen the difference in cluster coverage resulting from selective irradiation. The pattern of the clusters reproduces exactly micellar order on the surface of the substrate before plasma treatment.

Example 3

A silicon substrate was dip-coated in 5 mg/ml solution of poly(isoprene(570))-b-poly([2-vinylpyridine(HAuCl$_4$)$_{0.3}$](310). The sample was irradiated through the afore-mentioned photolithography mask for 7.5 min. Further treatment was performed as in Example 1.

Figure 4:
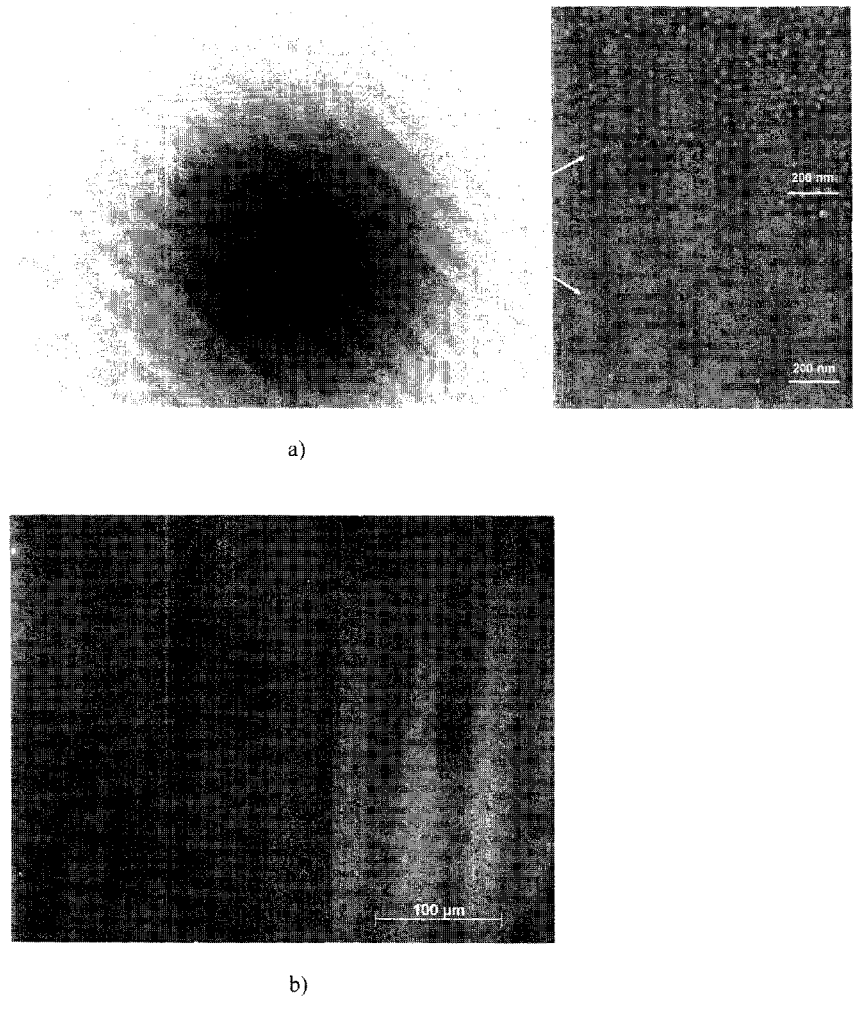
FIG. 4 shows SEM pictures (a) and light microscopy image (b) of a striped pattern of PI(570)-b-P(2VP(HAuCl$_4$)$_{0.3}$](310) micellar monolayer on a silica substrate after selective UV irradiation and lift-off in toluene.

FIG. 4 shows the SEM images (a) and light microscopy image (b) of the resulting substrate covered with monolayer block copolymer micelles arranged in stripes.

Example 4

A silicon substrate covered with self-assembled monolayer of vinyltriethoxysilane was dip-coated in 5 mg/ml solution of PS(1700)-b-P[2VP(HAuCl$_4$)$_{0.3}$](450) in toluene. As in Example 1, subsequently irradiation with UV lamp was performed for 1 h. The toluene was used to remove non-modified micelles from the substrate.

Figure 5:
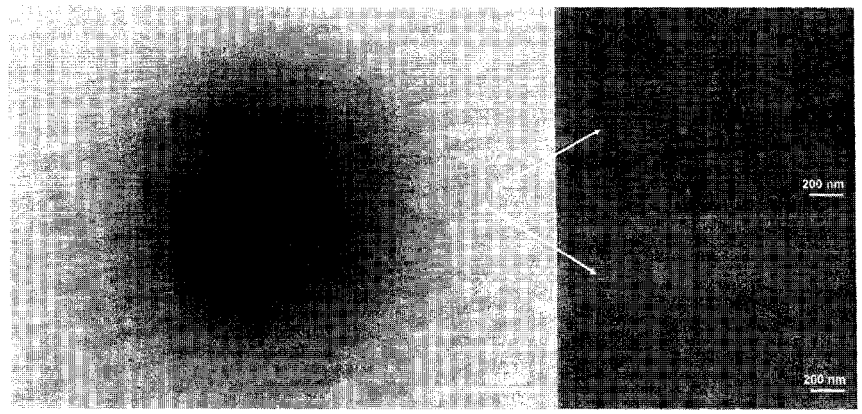
FIG. 5 shows SEM images of a pattern of PS(1700)-b-P[2VP(HAuCl$_4$)$_{0.3}$](450) micellar monolayers on a silica substrate pre-functionalized with vinyltriethoxysilane after selective UV irradiation and lift-off in toluene.

FIG. 5 shows SEM pictures of the silica substrate covered with a patterned monolayer of micelles after UV irradiation and lift-off. The micelles are arranged in stripes as it was inscribed in the irradiation step.

Example 5

A silicon substrate was dip-coated in 5 mg/ml solution of PS(1350)-b-P[2VP(HAuCl$_4$)$_{0.3}$](400) in toluene. The solution contained benzophenone (3 wt. % based on amount of polymer). As in Example 1, the sample was irradiated for 40 min. Further treatment was performed as in the previous examples.

Figure 6:
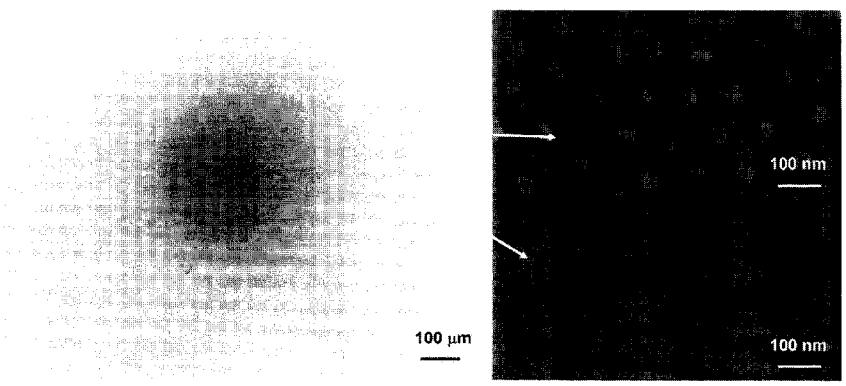
FIG. 6 shows SEM pictures of a pattern of PS(1350)-b-P[2VP(HAuCl$_4$)$_{0.3}$](400) micellar monolayers on silica substrates after selective UV irradiation and lift-off in toluene. The micellar solution contained benzophenone (3 wt. % based an amount of polymer).

FIG. 6 shows SEM pictures of the patterned monolayer of micelles on the silica substrate after UV irradiation and lift-off.

Example 6

The sample prepared as in Example 2 after plasma treatment was immersed in aqueous solution of hydroxylamine (0.23 mmol/l) and chloroauric acid (0.026 wt. %) for 3 min. The gold nanodots present on the surface function as seeds for electroless deposition of gold from the solution. As a result gold is deposited on the existing pattern and Au lines are formed.

Figure 7:
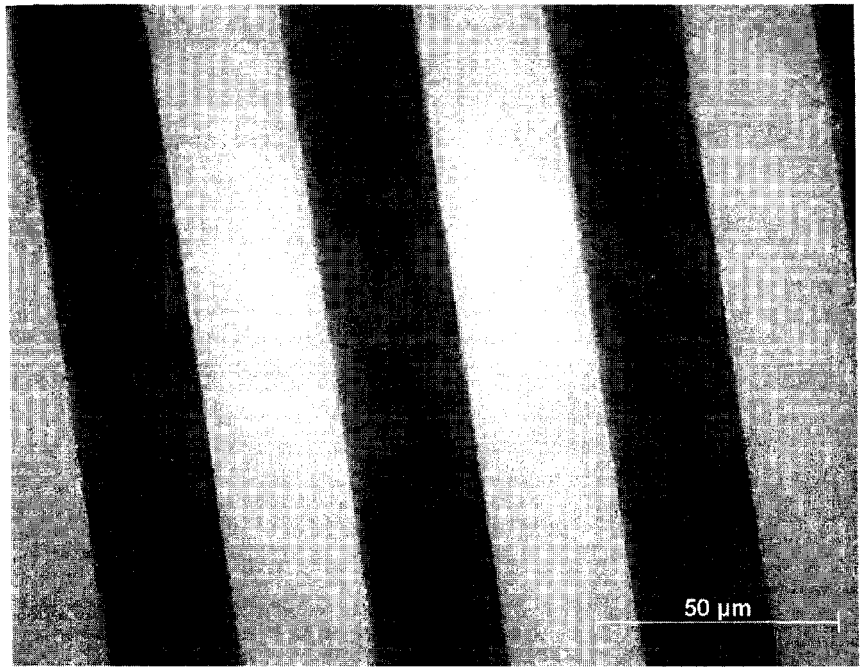
FIG. 7 shows a light microscopy picture of the resulting substrate covered with gold lines after electroless deposition treatment as obtained in Example 6.

FIG. 7 shows a light microscopy picture of the resulting substrate covered with gold lines after electroless deposition treatment.

The invention claimed is:

1. A method for manufacturing nanometrically surface-decorated substrates comprising the steps:
   (a) depositing a core-shell polymer system, prepared by taking up a polymer in a suitable solvent with formation of a dissolved core-shell polymer system and loading of at least part of the polymer cores with one or more, identical or different metal compounds, as a film onto a substrate so that at least one side of the substrate is configured in a regular structure,
   (b) irradiating said polymer film on the substrate as obtained in step (a) through a desired mask, by exposure to a source of radiation selected from visible light and ultraviolet light in the range from 410 nm to 157 nm that causes a chemical modification of the polymer in the irradiated areas,
   (c) removing the non-modified core-shell polymer system from the substrate by means of dissolution with a suitable solvent, and
   (d) removing the polymer core-shell system as irradiated in step (b) while producing metal clusters and/or metal compound clusters on the substrate without thereby significantly modifying the structure erected by the core-shell system;
   wherein the polymer is selected from poly(isoprene)-b-poly(2-vinylpyridine), poly(isoprene)-b-poly(4-vinylpyridine), poly(isoprene)-b-poly(ethyleneoxide), poly(butadiene)-b-poly(2-vinylpyridine), poly(butadiene)-b-poly(4-vinylpyridine), poly(butadiene)-b-poly(ethyleneoxide).

2. The method as claimed in claim 1, wherein the substrate is selected from the group consisting of Pt, Au, GaAs, $In_yGaAs$, $Al_xGaAs$, Si, $SiO_2$, Ge, $Ni_xN_y$, $Si_xGaAs$, InP, InPSi, GaInAsP, glass, graphite, diamond, mica, $SrTiO_3$ and their doped modifications.

3. The method as claimed in claim 1, wherein the metal compound is selected from a compound of Au, Pt, Pd, Ag, In, Fe, Zr, Al, Co, Ni, Ga, Sn, Zn, Ti, Si or Ge in the corresponding oxidation stages or mixtures thereof.

4. The method as claimed in claim 3, wherein the metal compound is selected from $HAuCl_4$, $MeAuCl_4$, where Me denotes alkali metal, $H_2PtCl_6$, $Pd(Ac)_2$, $Ag(Ac)$, $AgNO_3$, $InCl_3$, $FeCl_3$, $Ti(OR)_4$, $TiCl_4$, $TiCl_3$, $COCl_3$, $NiCl_4$, $SiCl_4$, $GeCl_4$, $GaH_3$, $ZnEt_2$, $Al(OR)_4$, $Zr(OR)_3$, $Si(OR)_4$, where R denotes a straight chain or branched $C_1$-$C_8$ alkyl residue, ferrocene, a Zeise salt or $SnBu_3H$ or a mixture thereof.

5. The method as claimed in claim 4, wherein the metal compound is $HAuCl_4$.

6. The method as claimed in claim 1, wherein the deposition of the polymer film onto the substrate is carried out by dipping, pouring, spin coating, or by adsorption in diluted solution.

7. The method as claimed in claim 6, wherein the deposition of the polymer film onto substrate is carried out by dipping in diluted solutions.

8. The method as claimed in claim 1, wherein the irradiation is carried out in such manner that the chemical structure of the polymer is changed, preferably crosslinked.

9. The method as claimed in claim 8, wherein in step (b) the source of irradiation is UV radiation source with emissions in the wavelength range from 190 to 410 nm.

10. The method as claimed in claim 1, wherein a photoinitiator and/or silane layer and/or low molecular compound with double bond functionality is used in order to support chemical modification of the core-shell polymer layer on the substrate.

11. The method as claimed in claim 10, wherein the photoinitiator is bis-2,4,6-trimethylbenzoyl-phenylphosphineoxide or benzophenone or a derivative thereof or a mixture thereof.

12. The method as claimed in claim 10, wherein the silane layer is made from vinyltriethoxysilane, allyltrimethoxysilane or 3-acryloxypropyl-trimethoxysilane.

13. The method as claimed in claim 1, wherein removing of the polymer core-shell systems and producing metal clusters and/or metal compound clusters on the substrate is carried out by pyrolysis, etching, oxidation or reduction processes.

14. The method as claimed in claim 13, wherein removing of the polymer core-shell systems and producing metal clusters and/or metal compound clusters on the substrate is carried out by hydrogen gas plasma process.

* * * * *